United States Patent [19]
Camerlenghi et al.

[11] Patent Number: 6,101,124
[45] Date of Patent: Aug. 8, 2000

[54] MEMORY BLOCK FOR REALIZING SEMICONDUCTOR MEMORY DEVICES AND CORRESPONDING MANUFACTURING PROCESS

[75] Inventors: Emilio Camerlenghi, Bergamo; Paolo Cappelletti, Seveso; Luca Pividori, Turin, all of Italy

[73] Assignee: STMicroelectronics S.r.l., Agrate Brianza, Italy

[21] Appl. No.: 09/327,111

[22] Filed: Jun. 7, 1999

Related U.S. Application Data

[63] Continuation of application No. 08/998,854, Dec. 29, 1997, Pat. No. 5,969,977.

[30] Foreign Application Priority Data

Dec. 27, 1996 [GB] United Kingdom .................. 96830657
May 23, 1997 [GB] United Kingdom .................. 97830238

[51] Int. Cl.$^7$ ................................................. G11C 16/04
[52] U.S. Cl. .......................... 365/185.11; 365/94; 365/51
[58] Field of Search ................................. 365/63, 185.11, 365/104, 230.03, 51, 94

[56] References Cited

U.S. PATENT DOCUMENTS

| | | | |
|---|---|---|---|
| 5,432,730 | 7/1995 | Shubat et al. | 365/63 |
| 5,517,448 | 5/1996 | Liu | 365/185.11 |
| 5,583,808 | 12/1996 | Brahmbhatt | 365/63 |
| 5,590,068 | 12/1996 | Bergermont | 365/63 |
| 5,761,119 | 6/1998 | Asano | 365/185.14 |
| 5,790,450 | 8/1998 | Nishizaki et al. | 365/104 |
| 5,822,248 | 10/1998 | Satori et al. | 365/185.21 |
| 5,862,076 | 1/1999 | Eitan | 365/63 |

FOREIGN PATENT DOCUMENTS

| | | |
|---|---|---|
| 0 552 531 A1 | 7/1993 | European Pat. Off. . |
| 0 580 467 A2 | 1/1994 | European Pat. Off. . |
| WO 96/08824 | 3/1996 | WIPO . |

*Primary Examiner*—Vu A. Le
*Attorney, Agent, or Firm*—Theodore E. Galanthay; Robert Iannucci; Seed IP Law Group PLLC

[57] ABSTRACT

An electronic memory device organized into sections which are in turn divided into blocks formed of cells and their associated decoding and addressing circuits, the cells being connected in a predetermined circuit configuration and each block being included between two opposite contact regions which are interconnected by parallel continuous conduction lines referred to as the bit lines. In the present invention, at least one interruption is provided in each bit line near a contact region by inserting a controlled switch which functions as a block selector. Advantageously, the proposed solution allows each block to be isolated individually by enabling or disabling as appropriate the switches of the cascade connected blocks. Also provided is a method of implementing the memory block, as organized into a matrix-like configuration, individually selectable from a plurality of blocks embedded in a memory device, wherein each memory cell is identified by a continuous bit line enabled by at least one block selector, by a broken bit line or 'segment' connected to the continuous one through an address device, and by a word line orthogonal to the direction of the bit lines, and formed on a substrate having a first type of conductivity.

18 Claims, 10 Drawing Sheets

Tunnel area definition (gate oxide removal) & cell threshold implant

Matrix mask and etch

Threshold Shift mask (optional)

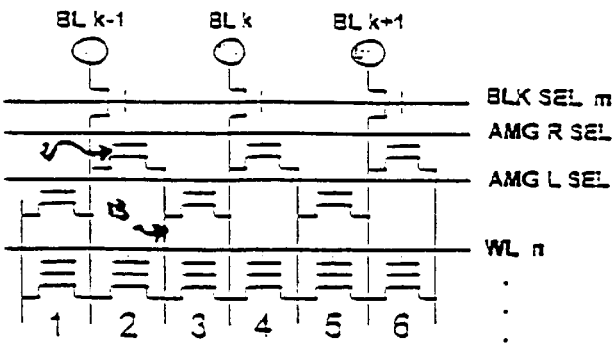

| OPERATION | BLOCK SEL k | BLOCK SEL m | AMG SEL R | AMG SEL L | BL k-1 | BL k | BL k+1 | WL n | WL j |
|---|---|---|---|---|---|---|---|---|---|
| READ CELL 2 | 0 | Vg-read | 0 | Vg-read | Vd-read | 0 | Float | Vg-read | 0 |
| READ CELL 3 | 0 | Vg-read | Vg-read | 0 | 0 | Vd-read | Prech. | Vg-read | 0 |
| PGM CELL 2 | 0 | Vg-write | 0 | Vg-write | 0 | Vd-write | Float | Vg-write | 0 |
| PGM CELL 3 | 0 | Vg-write | Vg-write | 0 | Vd-write | 0 | Float | Vg-write | 0 |
| ERASE BLK | 0 | Vg-write | 0 | 0 | Verase | Verase | Verase | Vg-er. | Vg-er. |

FIG. 14

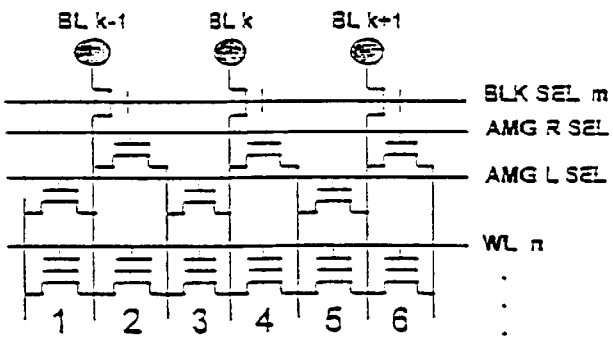

| OPERATION | BLOCK SEL k | BLOCK SEL m | AMG SEL R | AMG SEL L | BL k-1 | BL k | BL k+1 | WL n | WL j |
|---|---|---|---|---|---|---|---|---|---|
| READ CELL 2 | 0 | Vg-read | 0 | Vg-read | 0 | Vd-read | Prech. | Vg-read | 0 |
| READ CELL 3 | 0 | Vg-read | Vg-read | 0 | Vd-read | 0 | Float | Vg-read | 0 |
| PGM CELL 2 | 0 | Vg-write | 0 | Vg-write | 0 | Vd-write | Float | Vg-write | 0 |
| PGM CELL 3 | 0 | Vg-write | Vg-write | 0 | Vd-write | 0 | Float | Vg-write | 0 |
| ERASE BLK | 0 | Vg-write | 0 | 0 | Verase | Verase | Verase | Vg-er. | Vg-er. |

FIG. 15

MEMORY BLOCK FOR REALIZING SEMICONDUCTOR MEMORY DEVICES AND CORRESPONDING MANUFACTURING PROCESS

CROSS-REFERENCE TO RELATED APPLICATION

This application is a continuation of U.S. patent application Ser. No. 08/998,854, filed Dec. 29, 1997 now U.S. Pat. No. 5,969,977.

TECHNICAL FIELD

This invention relates to a memory block for implementing electronic memory devices integrated on a semiconductor and having cell matrices organized into sections, each section comprising at least one block.

The invention also relates to a process for manufacturing such blocks.

More particularly, the invention relates to an electronic memory device organized into sections which are in turn divided into blocks formed of cells and their associated decoding and addressing circuits, the cells being connected in a predetermined circuit configuration and each block being included between two opposite contact regions which are interconnected by parallel continuous conduction lines referred to as the bit lines.

The invention further concerns a method for manufacturing an integrated memory block, which block has a matrix-like configuration and is individually selectable from a plurality of blocks that make up a section and are embedded in a memory device.

BACKGROUND OF THE INVENTION

As is well known, electronic memory devices integrated on a semiconductor, whether of the EPROM or FLASH-EPROM type, are formed by cell matrices divided into 'sections'. These sections are essentially sub-matrices comprising blocks of memory cells having predetermined dimensions.

Each block is provided with bias and address lines as required for identifying the individual memory cells and decoding the information contained therein.

A memory device of this kind is described, for example, in European Patent No. 0 573 728 to SGS-Thomson Microelectronics S.r.l.

This prior document discloses an integrated device of the EPROM or FLASH-EPROM type, wherein the individual blocks comprise a cell matrix made up of a plurality of word lines and bit lines lying orthogonally to one another. The intersections, of each word line with each bit line, define the memory cells.

A structure of this kind is known in the art as a cross-point matrix, and is distinctive in that the bit lines are formed on the semiconductor substrate by parallel continuous diffusion strips.

An innovative aspect of this particular configuration resides in the absence of metallization contacts from the substrate area intended for integration of the memory cells; this feature greatly enhances the capability for integration on semiconductor substrates.

Metal contacts are only provided at the opposite ends of the bit lines and represent "end" terminations of each memory block.

An electric diagram of this configuration is shown in the appended FIG. 1, where the presence of opposite contact regions 4 at the boundaries of the plural memory cells 3 can be seen.

Each memory cell 3 is delimited by a corresponding main continuous bit line 7, and by a broken bit line also referred to as 'segment' of a bit line. Each segment is connected to an adjacent continuous bit line by an addressing active element 2. There is one addressing, right or left, active element 2 for each bit line segment.

This circuit arrangement, as adopted for each of n-th memory blocks 1, exhibits serious drawbacks whenever two or more blocks 1 are connected together in cascade to make up a section of the EPROM or FLASH-EPROM device, for example.

This connection, shown by way of example in FIG. 2, is provided by two contiguous memory blocks 1 sharing a region C(n) which incorporates the contacts 4, and is the cause for undesired electrical continuity between all the continuous bit lines 7 belonging to the different blocks 1.

Thus, so-called long bit lines are created as denoted by BLK, BLK+1, BLK+2 in FIG. 2. The bias voltage for each bit line 7 is the same in each of the cascaded memory blocks.

This may have serious disadvantages during a drain-side writing operation into each memory cell 3, since all of the remaining cells not involved in the writing, because belonging to two separate cascade connected n-th and (n−1)-th blocks, will find themselves in a potentially critical configuration known as 'drain stress'.

In fact, the uninvolved cells in the writing may be subjected to a condition of no voltage on the corresponding word lines and of a high, about 5 or 6 Volts, voltage value on the bit line 7.

This critical condition will be proportional to the number of cells sharing the same bit line 7.

A simple calculation, as exemplified by the formula herein below, shows that the overall stress time t-stress is related to the time t-write required for writing each memory cell 3, to the number N_cycles of the write cycles executed, and to the total number of word lines that intersect the biased bit line 7 for the write operation.

The last-mentioned term is obtained by multiplying the number n of cascaded memory blocks by the number m of the word lines included in each block.

A unity should be subtracted from the last-mentioned computed term to take account of the cell being written which is not subjected to a stress condition, as follows:

$$\text{t-stress-tot} = \text{t\_write} * [(n*m) - 1] * \text{N\_cycles}$$

The value of t_stress thus obtained for a single block 1 is a high value due to the product of n*m; for a memory device having a higher density than 1 Mb, this value would be greater than 1000.

Another problem with long bit lines 7 resulting from the cascade connection of several memory blocks 1 is encountered during an erase operation.

During this step, in fact, the memory cells that share the same bit line are biased to a relatively high voltage value of 5 or 6 Volts, whereas a zero or negative potential is applied to the word lines that intersect that bit line.

Thus, the erase operation simultaneously affects all of the cells sharing the same bit line 7 biased to a high state.

It will be appreciated that the circuit scheme of the prior art does not allow the memory blocks 1 to be selected individually.

A possible solution for overcoming this limitation could be that of having a decode block arranged to interrupt the matrix structure at each memory block 1.

While achieving its objective, such a solution would entail increased occupation of circuit area on the semiconductor substrate in order to accommodate the decode blocks.

Accordingly, an electrical scheme for the memory cells 3 would be desirable, wherein, while retaining the matrix configuration made up of elementary memory blocks, the individual blocks can be accessed independently even though connected together in cascade.

Another condition to be met is that the elementary memory block 1 should be compatible with conventional fabrication processes, such that its integration on the semiconductor substrate would involve no thorough re-designing of masks and process steps.

SUMMARY OF THE INVENTION

An object of this invention is to provide a novel circuit scheme and corresponding process for manufacturing memory blocks in a matrix type of layout, which have such constructional and functional features as to overcome the limitations and drawbacks of prior-art devices.

An embodiment of the present invention is directed to providing for controlled interruption of long bit lines by introducing a temporary electric discontinuity between cascade connected memory blocks.

The embodiment employs a memory block having at least one controlled switch arranged to act on each of the bit lines. Advantageously, the switch is placed near the region that accommodates the end contacts.

An embodiment of the present invention also provides a process for integrating an individually selectable memory block, which is compatible to a high degree with process flows conventionally used for making cell matrices.

The features and advantages of the device of this invention will be apparent from the following description of an embodiment thereof, given by way of non-limitative example with reference to the accompanying drawings.

BRIEF DESCRIPTION OF THE DRAWINGS

FIGS. 14 and 15 show two tables summarizing different modes of decoding the memory blocks of this invention, according to whether drain-side or source-side read and write operations are carried out.

DETAILED DESCRIPTION OF THE INVENTION

Figure 1:
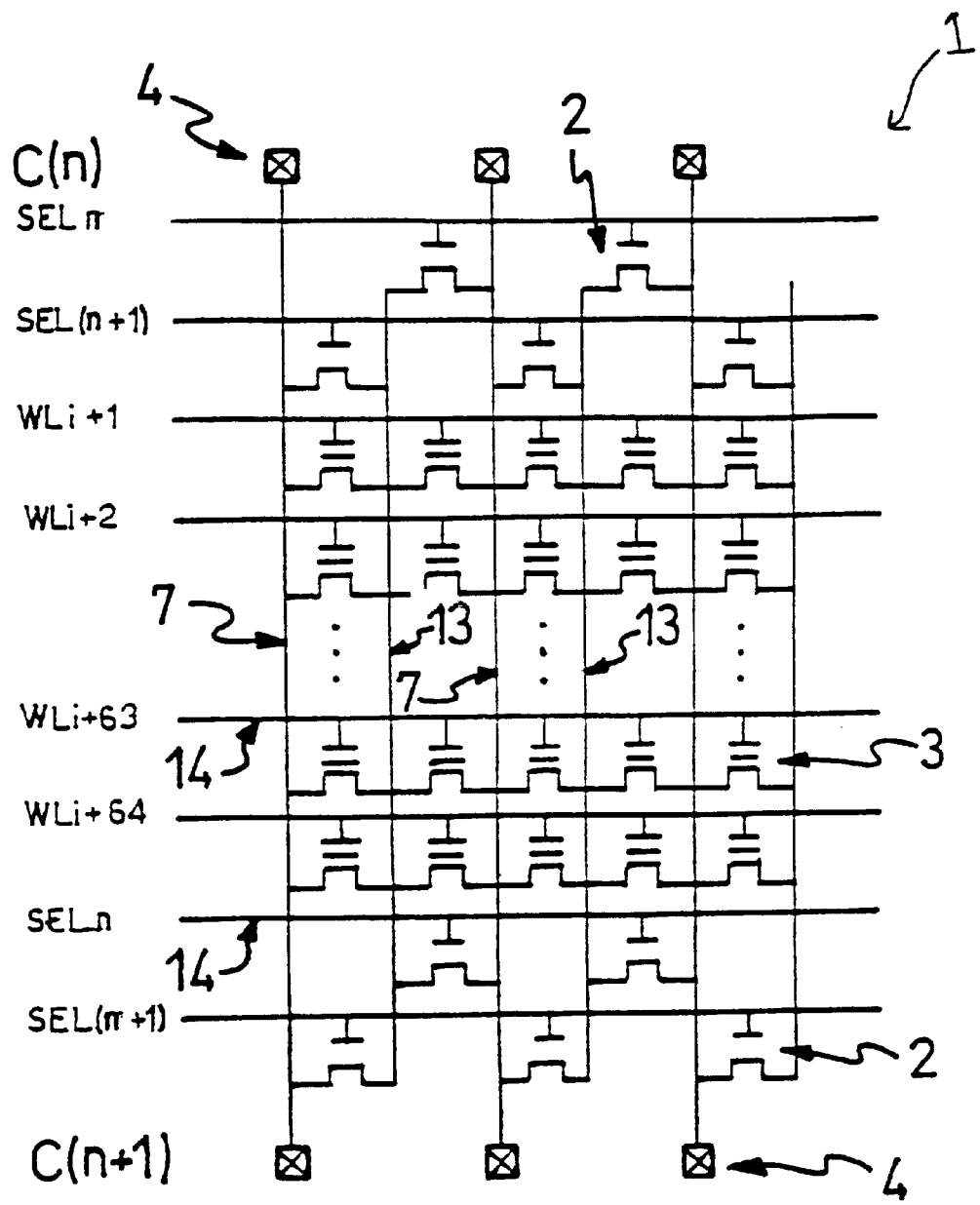
FIG. 1 is an electric diagram of a memory block comprising an EPROM or FLASH-EPROM device according to the prior art.

Referring to the drawing views, the main features of this invention will be described which differentiate it from what was achieved by the prior art heretofore.

FIG. 1 shows an electric diagram of a memory block 1 belonging to a typical EPROM or FLASH-EPROM device of the virtual ground contact-less variety as described, for example, in European Patent No. 573 728 discussed above.

This memory device is organized into sections formed of at least one block 1. In essence, one block 1 may be coincident with one section of the memory device, or a plurality of blocks 1 may be aggregated to form one section of the memory device.

Each block 1 comprises a plurality of cells 3 and plural, right or left, address and decode devices 2. Specifically, the following are provided: floating-gate MOS devices forming the individual memory cells 3; control and selection MOS devices 2 performing the functions of addressing and decoding the individual cells 3.

Figure 2:
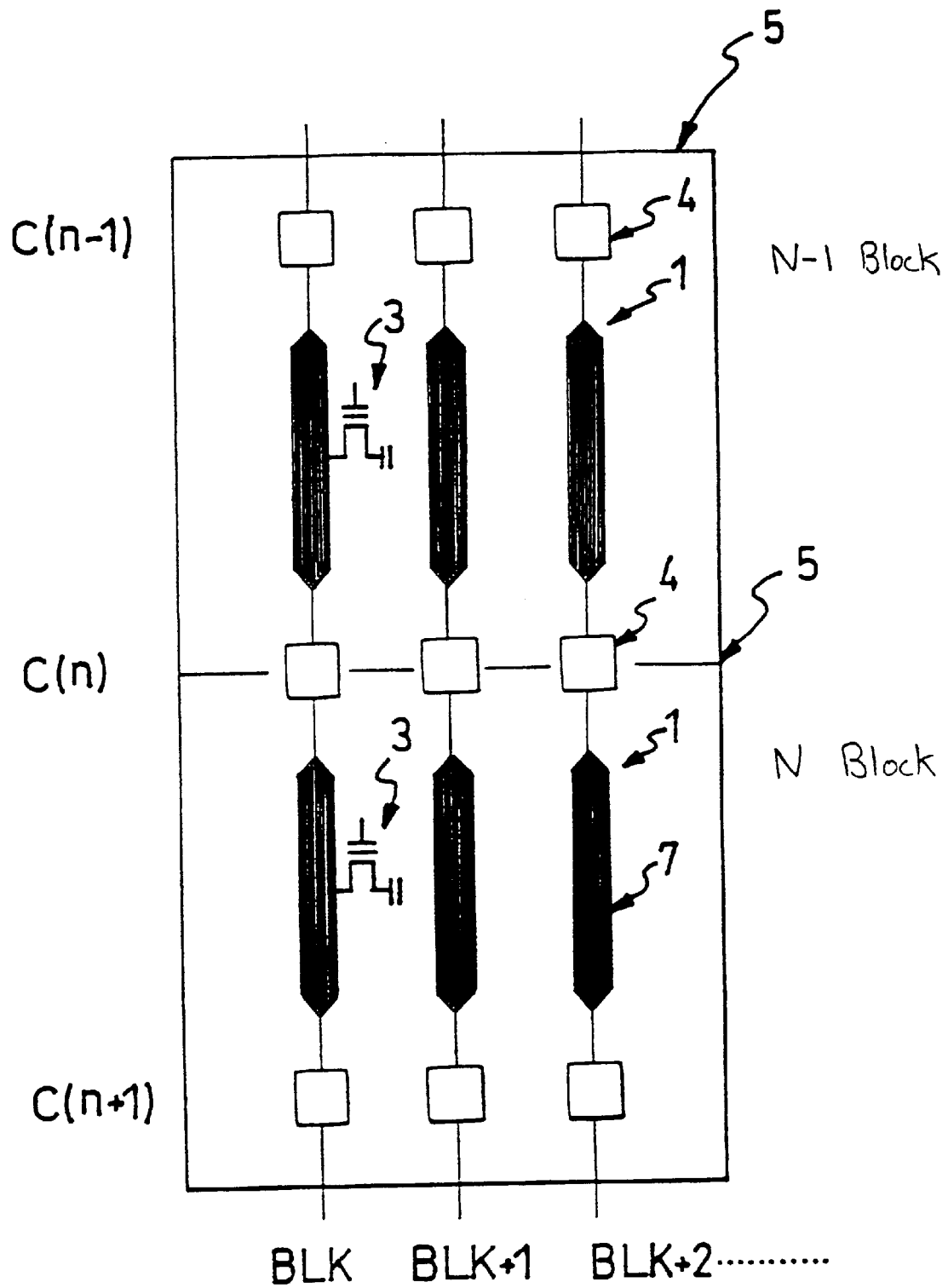
FIG. 2 is a schematic diagram of the cascade connection of two n-th and (n−1)-th blocks according to the prior art.

Each n-th memory block 1 is essentially a sub-matrix comprising memory cells 3, organized into rows (word lines) and columns (bit lines), and address devices 2. The sub-matrix is integrated within an area 5 of the semiconductor substrate which is bounded by opposite regions C(n) and C(n+1) of contacts 4 arranged for contacting the opposite ends of the bit lines formed on the substrate, as shown in FIGS. 1 and 2.

For each n-th memory blocks 1, the contacts 4 in the region C(n) have mirror-like symmetrical correspondence in an opposite contact region C(n+1) at the other end of the bit lines.

In this way, pairs of contact regions 4 are defined which delimit the parallel continuous bit lines 7 extending within the area 5 of the n-th memory block 1.

The plurality of memory cells 3 are uniquely determined by the intersections of the continuous bit lines 7 with the word lines. There are also segmented bit lines 13 connected to the main bit lines 7 through right or left decoding and addressing transistors 2.

FIG. 2 shows schematically a cascade connection of two n-th and (n−1)-th memory blocks 1 integrated in respective substrate areas 5. These blocks share a common region C(n) of contacts 4.

The cascade connection of the blocks results in a single continuous bit line 7 being formed wherethrough electric signals are received by and transmitted to the memory cells 3 of one or the other of the two interconnected blocks 1.

The bit lines 7 resulting from the connection of the two n-th and (n−1)-th blocks will be designated hereinafter BLK, BLK+1, BLK+2, for convenience sake. These lines 7 are also referred to as 'long bit lines'.

The cascade arrangement used for connecting the memory blocks 1 originates the drawbacks and disadvantages which have been discussed in the preamble to this description.

In fact, during the step of writing a single memory cell 3 belonging to the n-th block and connected to a predetermined bit line such as BLK, all the cells 3 that share the same bit line BLK are in a less-than-ideal condition of 'drain stress'.

Likewise, erasing a single cell may force all the cells that share the same line BLK to be erased. Their number will be the larger, the more memory blocks 1 are connected together in cascade.

Thus, an ability to independently select each n-th memory block so as to limit the aforementioned unfavorable effects of the cascade connection is desirable.

Figure 3:
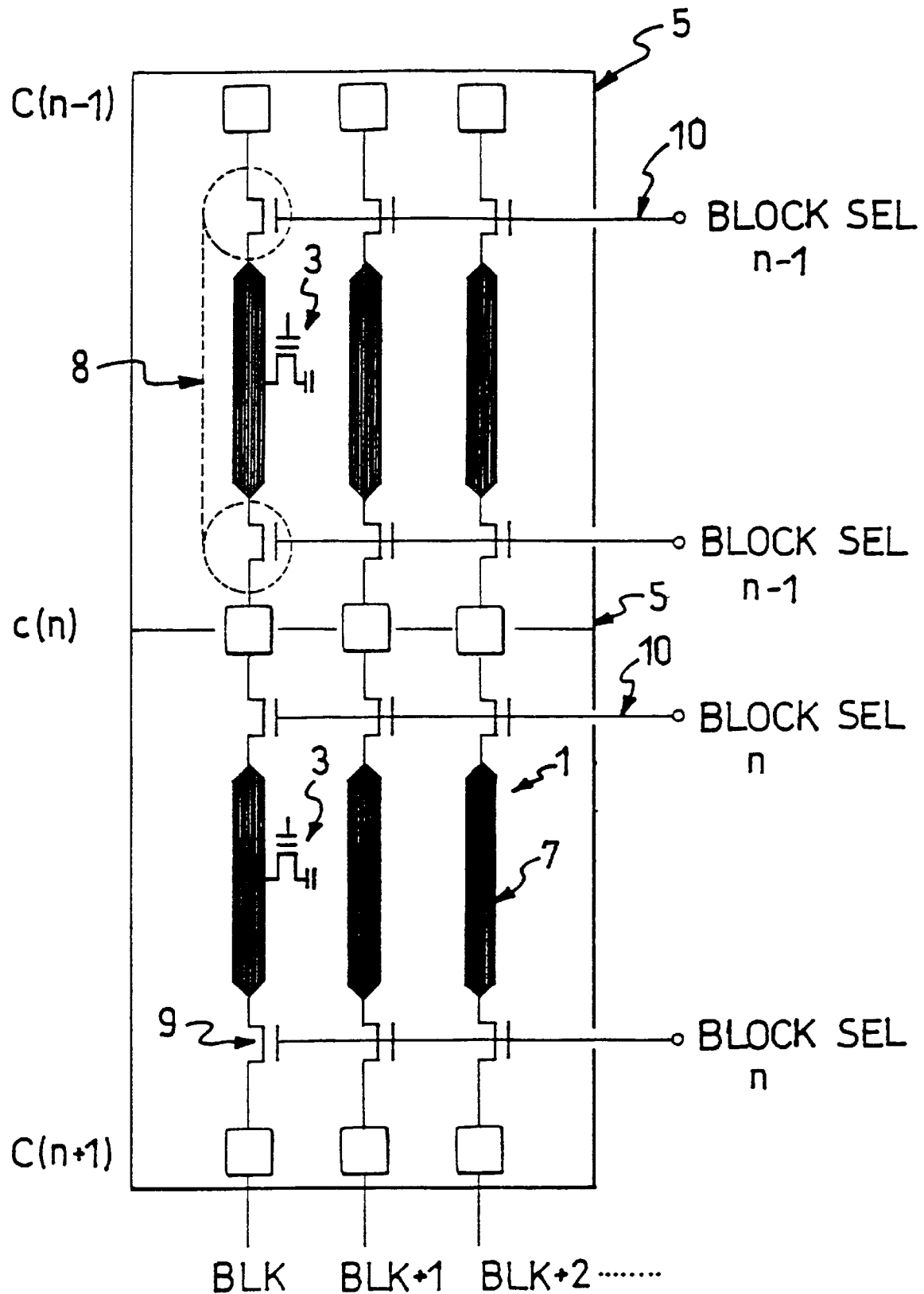
FIG. 3 is a schematic diagram of the cascade connection of two n-th and (n−1)-th blocks in a cross-point matrix, which can be selected individually in accordance with this invention.

According to an embodiment of the invention shown in FIG. 3, this is achieved by introducing, in each substrate area 5 of the memory block 1, at least one interruption on each bit line 7 near a contact region C(n) or C(n−1). The interruption may be implemented by a controlled switch 9 functioning as a block selector 8.

In a preferred embodiment, the block selector 8 comprises two controlled switches 9 connected to the opposite ends of each bit line 7 near the regions C(n) and C(n−1) of the contacts 4.

FIG. 3 shows a possible electric insertion scheme wherein the controlled switches 9 are active elements of the MOS type having three terminals.

In particular, it can be seen that each active element 9 is a transistor connected, through one of its source and/or drain terminals, to a contact in the region C(n) and/or region C(n−1), while the other source and/or drain terminal connect (s) the corresponding bit line 7. The control terminal 10 of the transistor 9 receives a block elect signal.

In this way, the bit lines 7 of the n-th memory block 1 can be isolated electrically from the other cascaded blocks by actuating the block selectors 8 through the control terminals 10 of the switches 9.

For easier integration of the block selectors 8, it is preferred to have all the control terminals 10 of the switches 9 placed near the same region of contacts 4 connected together.

In the above embodiment, each n-th memory block 1 has, therefore, only two control terminals 10 for two distinct arrays of switches 9 located near the opposite contact regions C(n) and C(n+1). These terminals 10 are driven by signals designated 'BLOCK SEL n' in FIGS. 3 and 4.

To optimize the integration processes, the block selectors 8 are implemented with the same technology as is used for forming the selection transistors 2 provided in the substrate area 5.

Preferably, the transistors 9 are implemented with MOS technology; alternatively, bipolar transistors could be used instead.

Figure 4:
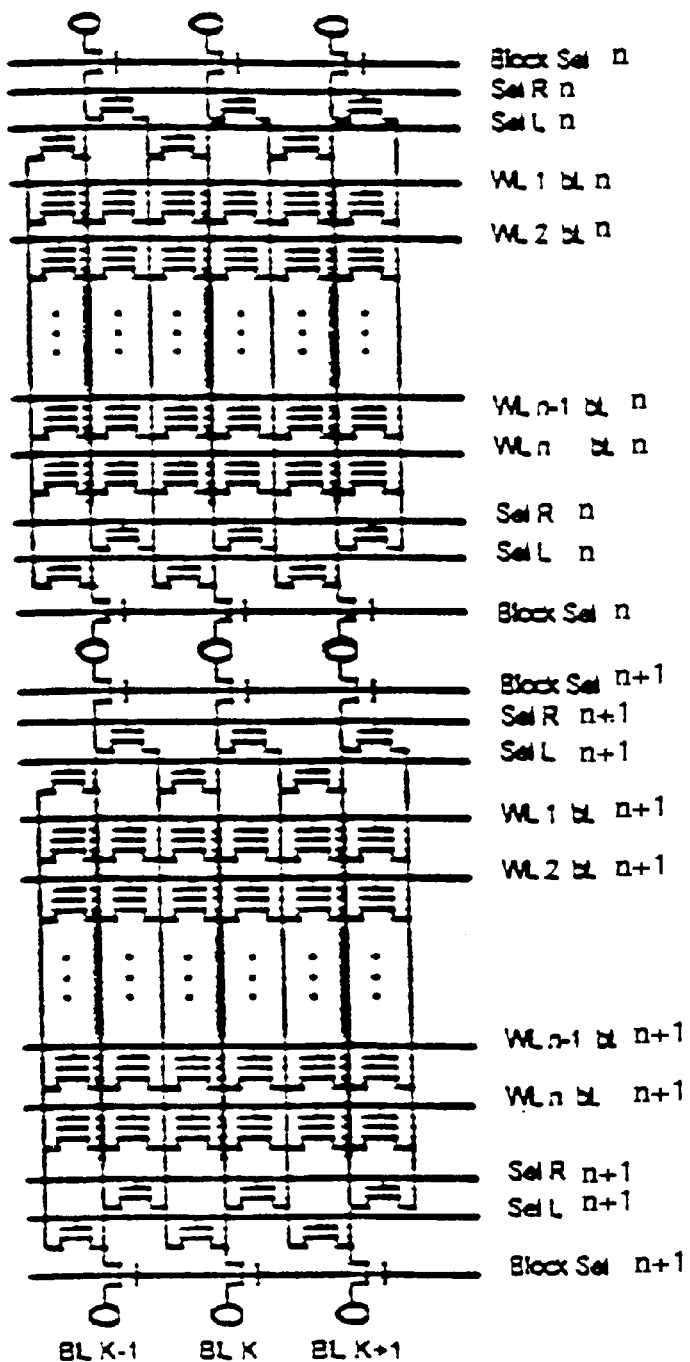
FIG. 4 is a general electric diagram showing a possible internal configuration of two cascaded n-th and (n−1)-th blocks which can be selected individually in accordance with the principle of this invention.

FIG. 4 shows an electrical scheme of cascade connection for two n-th and (n+1)-th memory blocks which can be selected individually by pairs of select signals designated 'Block Sel n' and 'Block Sel n+1'.

The invention, besides providing a novel circuit configuration of the memory block 1, also suggests a suitable method of decoding the information contained in a generic memory cell 3.

A summary of the write, read and erase operations is provided in FIGS. 14 and 15, which show two tables listing the respective control signals, bit lines, word lines, and corresponding electrical state values required by the decode operation of interest.

The reading of a memory cell 3, e.g., the memory cell located in third position on the schematic diagram of FIG. 14 or 15, will now be discussed.

This cell is identified by appropriate enable signals and interconnect lines comprising:

a pair of signals 'BLOCK SEL m' (of which only one is shown because the block configuration is symmetrical) identifying and enabling the m-th memory block to which the third cell belongs;

a bit line BLK connecting the source region of the memory cell;

a broken bit line 13 connecting the drain region of the memory cell 3;

a drive signal 'AMG SEL R' for the right-hand address active element 2 adapted to connect the aforesaid broken bit line 13 to the continuous bit line BLK-1;

a word line WLn on which the electric state of the gate region, or control gate, of that third cell is dependent.

As can be gathered from the tables of FIGS. 14 and 15, there may be two different modes of reading the same cell, which will be referred to herein as 'source' and 'drain' readings.

The first mode is illustrated by the exemplary table of FIG. 14 where, by referring to the line corresponding to the reading of the third cell, one can readily see which are the electric states of the enable signals and the bias of the corresponding bit and word lines.

Any writing, reading, or erasing operation on individual cells, or a plurality of cells, regardless of the mode selected, is always preceded by a step of selecting the m-th block that isolates electrically the selected block from the other cascaded blocks sharing the same bit lines 7.

This is made possible by the corresponding signal 'BLOCK SEL m' being active.

This is followed by a step of addressing the individual cell 3 within the selected m-th block by enabling the corresponding pair of right or left address devices 2, as driven by the signals 'AMG SEL R' or 'AMG SEL L'.

This step allows the drain region of the selected cell to be connected to a corresponding broken bit line 13, itself connected to an adjacent main bit lines 7 through the address active element 2.

In this case, the third cell to be read is identified by application of a voltage Vg-read, the signal to the block selector 'BLOCK SEL m', and the address signal 'AMG SEL R'.

This allows an electric path to be established between the bit line BLK and the line BLK−1 under control by the third celSEL Lected whose information contents is to be decoded.

For this decoding operation, the cell must be biased by applying a potential 'Vd-read' to the continuous bit line BLK and a zero potential to BLK−1.

A sense amplifier, not shown because conventional, will be connected downstream of the bit lines for identifying the logic contents of the cell.

To prevent undesired errors from affecting this decoding step, the bit line BLK+1 should be pre-charged to a voltage Vd-read.

This is made necessary by that the signal 'AMG SEL R', which enables the right-hand address devices 2, will be connecting the bit line BLK, as biased to a voltage Vd-read, to the drain region of cell number five.

Thus, it will be appreciated that the measurement from the sense amplifier can be distorted by a spurious current being drawn or delivered by/from the cell in the fifth position if the potential of the bit line BLK+1, connected to the source region of the fifth cell, were other than the value of Vd-read.

At this point, it will be mandatory to also connect the bit lines BLK+2, BLK+3, . . . to a potential Vd-read, so as to prevent the generation of parasitic currents in the cells in the seventh, ninth and following positions, which could distort the measurement from the sense amplifier during the third cell reading step.

Similar considerations apply when the 'drain' mode of operation, summarized in the table of FIG. 15, is selected.

It can be readily seen that reading the third cell requires respective values of Vd-read and zero for the bias voltages of the bit lines BLK−1 and BLK.

These values are reversed from the 'source' reading mode due to the electrical exchange that takes place between the source and drain regions of the memory cells.

This exchange means that, to avoid the generation of parasitic currents—similar to what happened in the 'source' mode of reading the third cell, the bit lines BLK−2, BLK−3, and following (not shown in FIG. 14) should be biased to a voltage Vd-read, whereas the lines BK+1, BLK+2, . . . may be left disconnected.

In this case, in fact, the cells which are responsible for the production of parasitic currents are those alternately ahead of the third cell, e.g., the first cell.

By contrast, having writing operations executed on a memory block 1 according to the invention poses no problems because they would be similar to reading operations but for the analog values of the bit line bias voltage, which become Vd-write and zero.

Another noticeable difference is that writing operations require no precharging of the adjacent bit lines to the biased lines, because the sense amplifier would not be used.

The erase operation, whose effects are restricted in this circuit configuration to just the cells in the selected memory block, requires that the signals 'AMG SEL R' and 'AMG SEL L' be not activated.

This will disable the right and left addressing devices 2, thereby leaving the segments 13 of bit lines to float.

This, erasing is effected by biasing, to a zero or negative voltage Vg-erase, all those word lines, such as $W_{Ln}$ and $W_{Lj}$, which control the gate regions of the cells in the selected block, and to a positive voltage V_erase, all those bit lines, such as BLK−1, BLK, BLK−1, which belong to the block.

The internal organization of the memory blocks 1 is a feature that may simplify the integration of the select devices 8 needed for practicing the invention.

The steps of the method for manufacturing the individually selectable memory blocks 1 in integrated form will now be described in relation to a matrix-like organization with virtual ground circuitry as described in Patent Application EP 0 573 728, for example.

The description of this method is based on FIGS. 5 to 13, which show respective plan views of the semiconductor substrate whereon the devices and interconnections required for defining the memory block 1 of this invention according to the electric diagram of FIGS. 3 and 4 are implemented in integrated form.

Certain process steps will not be discussed in any detail hereinafter to avoid overburdening the description with elements of secondary importance or already well known to the skilled persons in the art.

Figure 5:
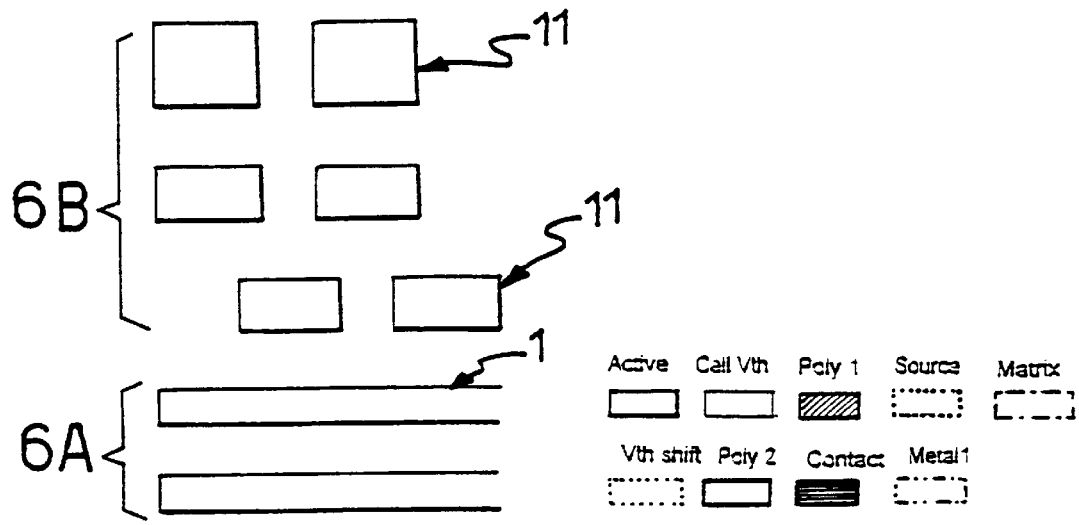
FIGS. 5 to 13 are plan views of the significant portion of a semiconductor substrate through the evolution of a fabrication process according to the invention directed to producing the memory block illustrated diagrammatically by FIG. 4 in integrated form.

In FIG. 5, a plan view of a semiconductor substrate 5 is shown, after a plurality of active areas 11 have been defined and formed thereon by photolithography.

The semiconductor substrate 5 comprises an epitaxial layer having conductivity of a first type, and is divided into plural active areas (identifiable by reference to the legend attached to each Figure) which are isolated from one another by the selective growth (LOCOS) of a field oxide layer.

FIG. 5 and the following Figures are plan views showing but a portion of the substrate. However, the skilled persons in the art will readily distinguish, in that matrix portion and in the active area patterns, a memory cell region 6A and a selection transistor region 6B.

The former region 6A is formed of a first plurality of parallel strips extending along a direction referred to as the 'word line direction', and comprises a plurality of memory cells, whereas the latter region 6B is formed of pads or islands and includes plural address and decode devices 2 and block selectors 8.

These islands are provided at three levels with the devices 2 for addressing the cells 3 placed at the first two levels contiguous to the region 6A, and the block selecting devices 8 placed at the third or outermost level.

It should be remembered that the introduction of the selector 8 leads to having a third additional level of islands with respect to the instance where the memory blocks 1 cannot be selected individually.

Subsequently to defining the active areas, a layer of gate oxide is grown to form the address 2 and select 8 devices.

Figure 6:
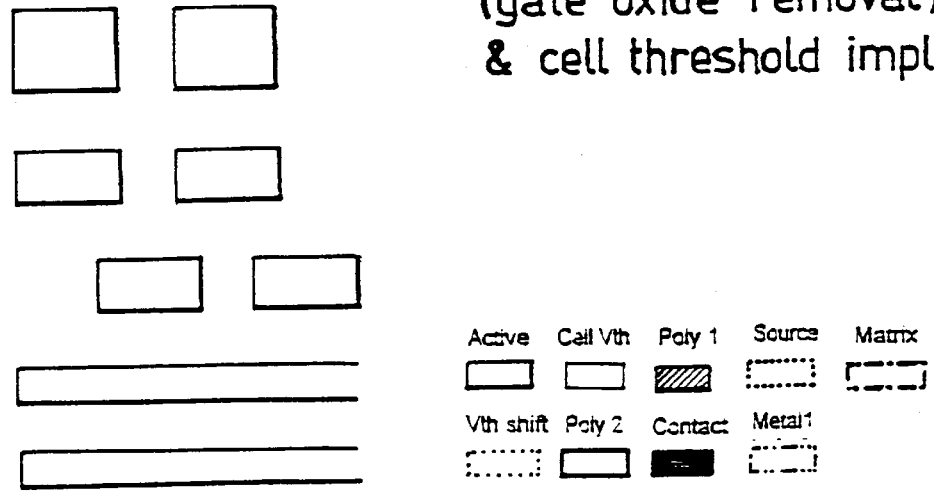

A subsequent masking operation will allow removal of the gate oxide layer from the region 6A and the carrying out of an implantation operation in the hatched area of FIG. 6 (item 'Cell Vth' in the legend) for modifying the threshold voltage of the memory cells 3 to be.

On the other hand, a tunnel oxide layer, necessary for forming the memory cells 3, will be grown on the active areas of the matrix.

To implement memory cells 3 using MOS devices with dual capacitive coupling or "floating gate", the process flow should include a multiple deposition all over the substrate surface as required to provide a ply structure comprising: a first conductive layer (known as POLY1), an interpoly dielectric layer, and a second conductive layer (POLY CAP).

The material employed for the conductive layers is typically polysilicon, whereas the intermediate dielectric layer may be ONO (Oxide-Nitride-Oxide), for example.

Figure 7:
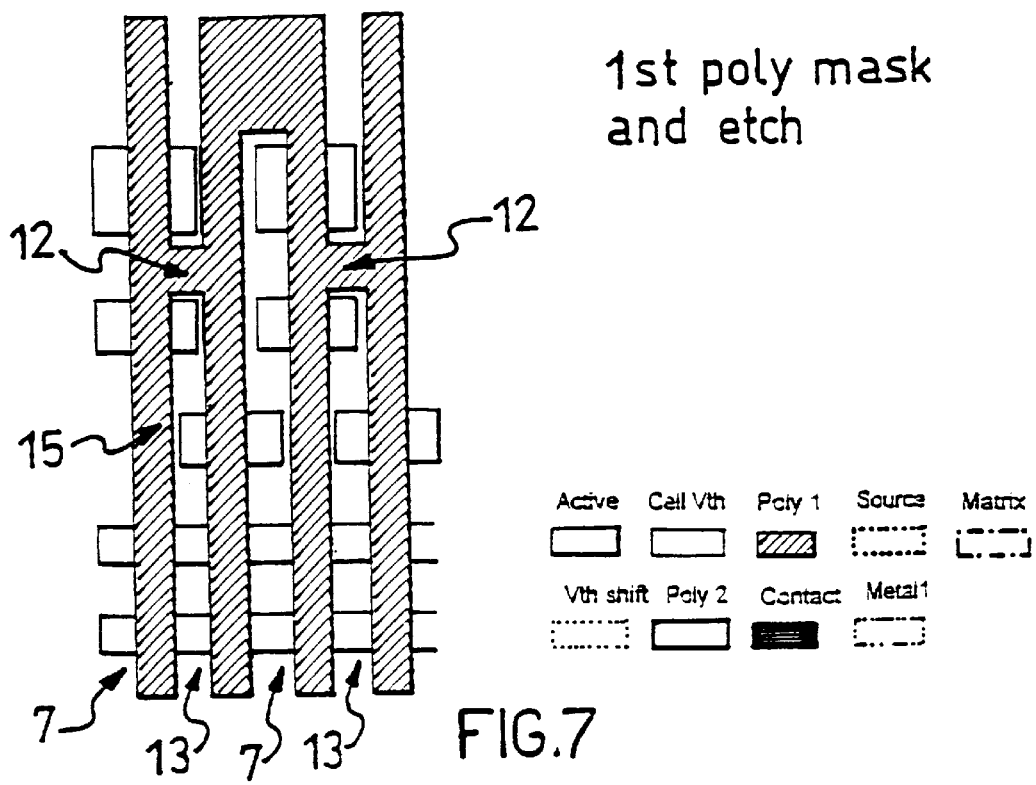

FIG. 7 is a plan view of the semiconductor substrate overlaid by a mask, known to the skilled persons in the art as the POLY1 mask, which is used for defining the bit lines 7.

By a conventional photolithographic process step, the unprotected ply structure by the POLY1 mask is cascade etched to remove the second conductive layer, intermediate dielectric layer, first conductive layer, and field oxide layer, if any, in this order.

This step of the inventive method distinguishes itself from previously known ones, e.g., from the teachings of Patent Application 0573728, in that the POLY1 mask used for defining the bit lines is not formed of simple parallel strips.

The method of this invention suggests instead of using a POLY1 mask comprised of a plurality of parallel strips 15 which are alternately joined by strip-linking areas 12 provided between the third and second levels of islands in the region 6B.

This mask is advantageously utilized in the invention for transferring, onto the semiconductor substrate, a raised architecture including the gate regions of all the MOS devices provided in the memory block.

These parallel gate regions will be oriented along an orthogonal direction to the 'word line direction', and alternately connected in the region 6B by barrier regions, also referred to as interruptions.

The above solution allows the areas intended for implanting continuous 7 and broken 13 bit lines to be patterned univocally.

The areas intended for implantation of the bit line segments 13 can be easily told because their longitudinal stretch is limited by specially provided barrier regions. This restricts their extension in the circuitry region 6B to the second island level only.

These barrier regions are also needed for properly defining the topography of the block selectors 8 which are to connect future regions of contacts 4 to the continuous bit lines 7.

Still using the same POLY1 mask, an arsenic ion implantation step is then carried out for imparting $N^+$ electric conductivity to the continuous bit lines 7 and the segments 13 of broken bit lines, as previously explained.

Figure 8:
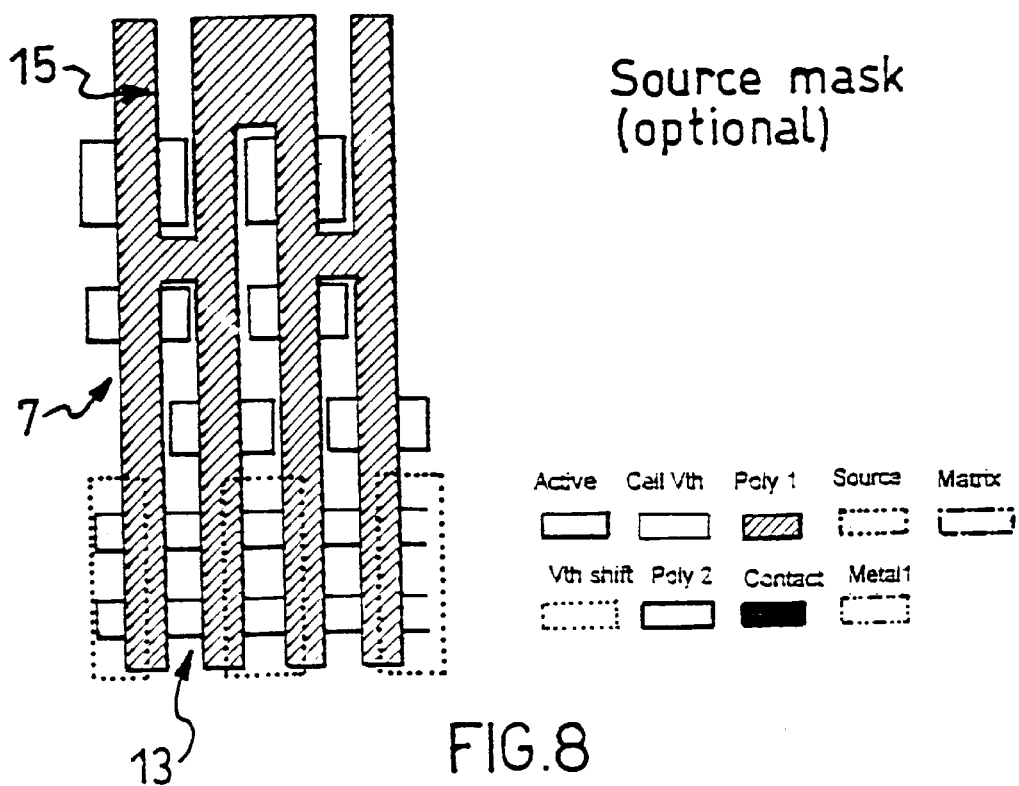

A further ion implantation step may optionally be carried out by a masking operation, as shown in FIG. 8 in the corresponding areas designated 'source', limited to the region 6A of the memory cells for conferring suitable features (gradual profile) on the source regions of the memory cells 3.

This implantation is usually effected with phosphorus in order to obtain a gradual junction profile in the source regions of the cells 3.

At this stage of the process, the gate regions included between the bit lines 7 and 13, which were previously exposed for the implantation steps, are sealed by an oxidation step.

Thereafter, a process of planarization of the circuit architecture formed during the steps just described will be necessary, preparatory to a new photolithography step using a mask known as the "matrix mask".

Figure 9:
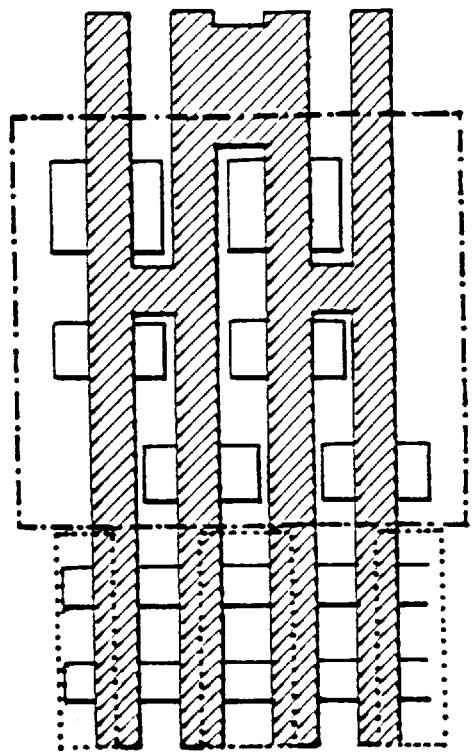

This mask, shown in FIG. 9, enables the second conductive layer and the intermediate dielectric layer in the region 6B to be etched away, and so also the islands intended for integration of the addressing 2 and selecting 8 devices.

Figure 10:
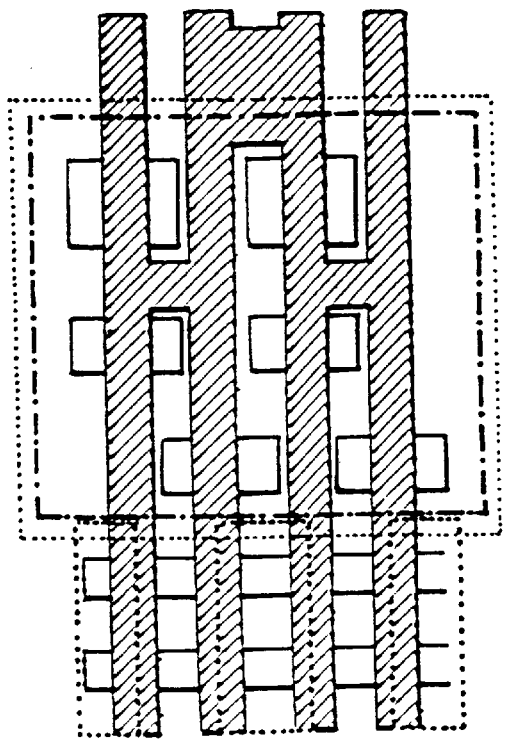

FIG. 10 shows a hatched area designated 'Vth Shift' which can optionally be implanted, using a suitable mask, for adjusting the threshold voltage of the MOS devices 2 and 8 in the region 6B.

At this point, a multiple deposition can be carried out of a protective conductive layer designated POLY2 and a finish conductive layer.

Materials like polysilicon and tungsten silicide ($WSi_2$) are usually employed to form the protective conductive layer and the finish conductive layer, respectively.

Figure 11:
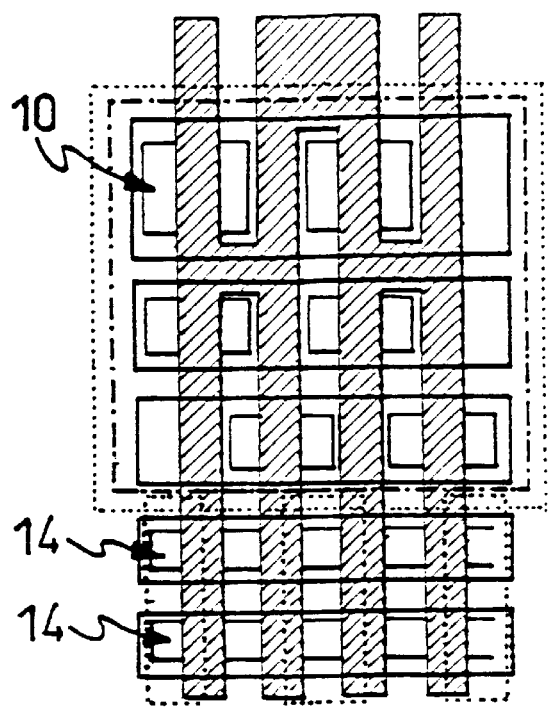

For defining the plurality of memory cells 3, and the block addressing 2 and selecting 8 devices, a self-alignment etching should be effected in both the region 6A of the memory cells and the region 6B of the selection transistors by a photolithographic step using a mask known as the 'POLY2 mask', as can be gathered from the plan view of the substrate in FIG. 11.

This mask will comprise parallel strips with different widths, oriented in the so-called 'word line direction'.

This self-alignment etching should be applied in two successive sub-steps so as to properly define the two different types of MOS components utilized for the address devices 2, block selectors 8, and memory cells 3.

During a first sub-step, material from the finish conductive layer and the protective conductive layer is removed from the photolithography unprotected areas.

In the region 6A of the cells, this first self-alignment sub-step will also remove the second conductive layer, and the first conductive layer in the region 6B of the selection transistors.

During the second sub-step, the intermediate dielectric layer and first conductive layer are removed from the region 6A, with the region 6B suitably masked off.

Thus, the spatial definition of the gate regions of the MOS devices is complete, whether these are memory cells 3 or address and selection elements 2 and 8.

Parallel leads formed in the protective conductive and finish layers will then connect electrically the gate regions of the MOS devices.

The skilled persons in the art will recognize, in the circuit architecture described so far, that of a memory block 1 having a matrix topography and being selectable individually.

In further detail, it can be observed that the parallel strips defined in the region 6A constitute word or 'control gate' lines, while similar strips in the region 6B are enable lines for the address devices 2 and the block selectors 8.

To finalize the n-th memory block, standard steps are carried out which include: sealing the memory cells defined by the self-alignment etching; effecting implantations of the $N^-$, $P^-$ and $N^+$, $P^+$ types to complete the n-channel and p-channel MOS devices in the region intended for matrix complementary CMOS circuitry; depositing an insulating dielectric layer; a photolithographic and implantation step to pattern and form the contact regions 4 connected to the block selectors 8; depositing a metal layer; a further photolithographic step for patterning and forming the layout of the electric interconnections; and a final passivating step.

Figure 12:
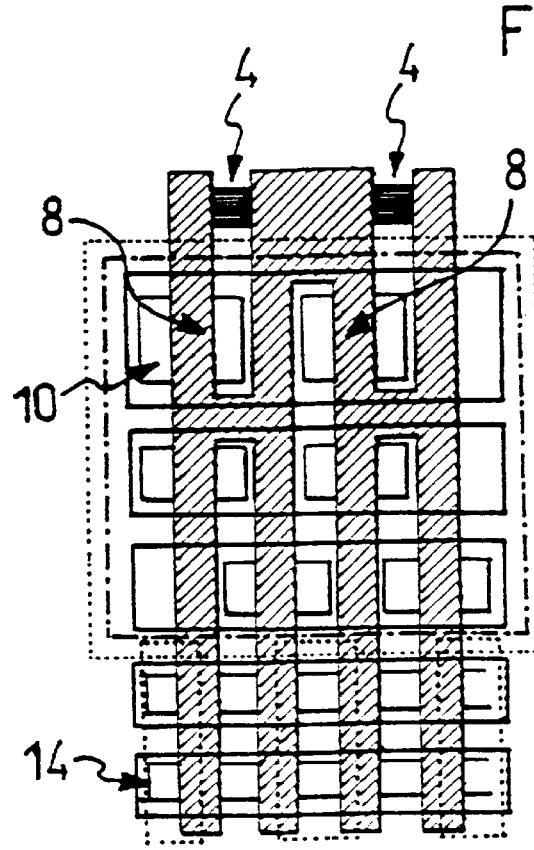
Figure 13:
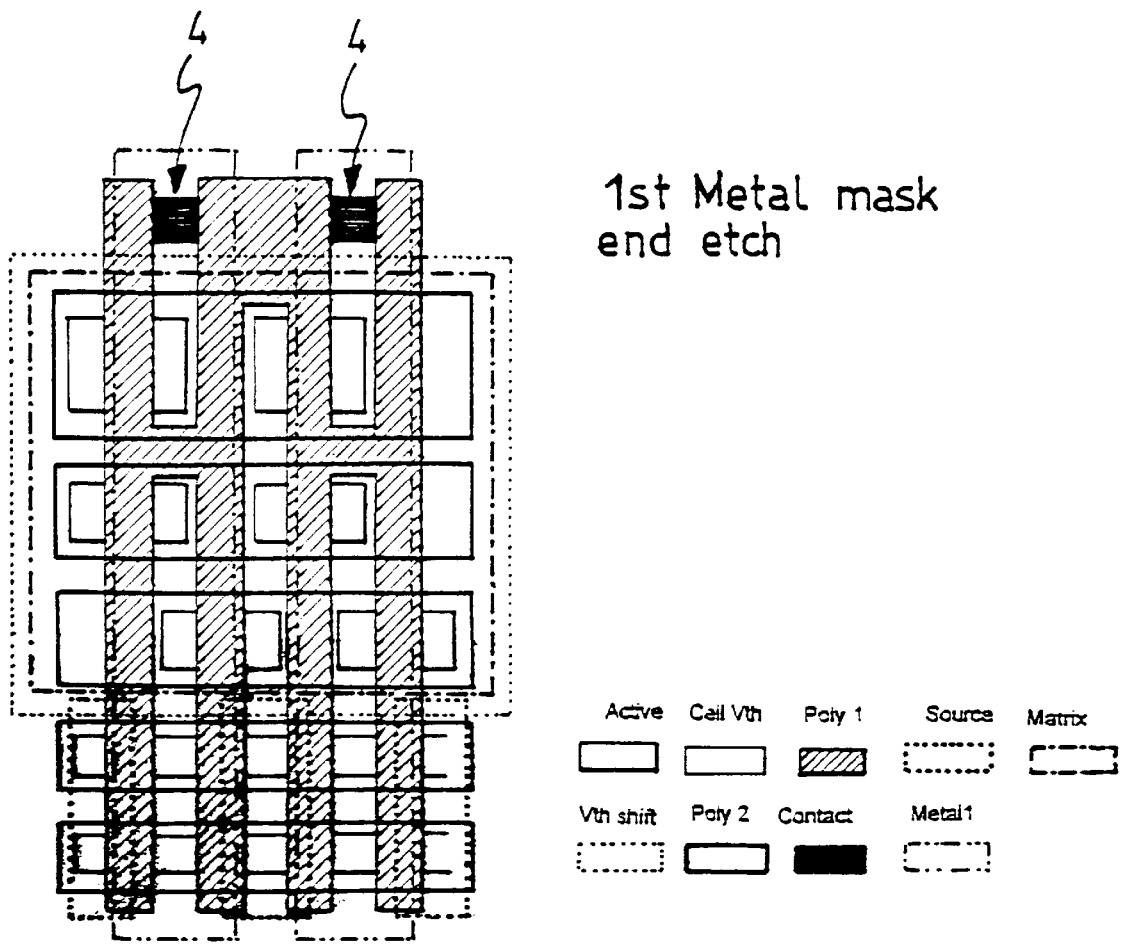

The locations of the contact regions 4 contiguous to the block selectors 8, the latter being integrated in the region 6B at the third island level, can be clearly inferred from FIGS. 12 and 13.

Advantageously, by introducing the block selection devices 8, the aforementioned drawbacks of the prior art can be overcome, and the access time for decoding the individual memory cells 3 improved.

It will be appreciated that the ability to select memory blocks 1 on an individual basis also leads to reducing the overall parasitic capacitance on each of the continuous bit lines 7 which is strictly tied to the number of memory blocks 1 connected together in cascade.

The resulting circuit structure is compatible with the method known heretofore for integrating memory blocks comprised of EPROM or FLASH-EPROM devices.

In summary, the fabrication method proposed by this invention involves a limited increase in the number of active areas provided in the circuitry regions and a slight modification of the standard mask used for defining the bit lines.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electronic memory device organized into sections which are in turn divided into blocks formed of cells and their associated decoding and addressing circuits, the cells being connected in a predetermined circuit configuration and each block being included between opposite first and second contact regions which are interconnected by parallel continuous conduction lines referred to as bit lines, wherein each bit line, near one of the contact regions, includes a controlled switch therein to function as a block selector and provide an interruption in the bit line; wherein the first contact region includes first and second contacts coupled to first and second bit lines, respectively, and the controlled switch includes a control terminal and is coupled between the first contact and a first conduction terminal of a selected memory cell having a second conduction terminal and a control terminal, the memory device further comprising an address transistor coupling the second bit line to the second conduction terminal of the selected memory cell, wherein during a read mode, the second contact and control terminals of the controlled switch and the selected memory cell are coupled to a read voltage, the second conduction terminal is coupled to the second contact, and the first contact is coupled to ground.

2. The memory device according to claim 1 wherein a plurality of the contact regions are each adjacent to plural controlled switches, which each include control terminals, the control terminals of the switches inserted near the same contact region are connected together, thereby defining a single control terminal associated with each of the plurality of contact regions.

3. The memory device according to claim 1 wherein said controlled switch is formed using a technology used for forming the individual memory blocks.

4. The memory device according to claim 1 wherein said controlled switch is formed with a different technology from a technology used for forming the individual blocks.

5. The memory device according to claim 3 wherein the technology used is a MOS technology.

6. The memory device according to claim 1 wherein said controlled switch is a MOS transistor.

7. An electronic memory device organized into sections which are in turn divided into blocks, each block of the electronic memory device comprising:
- a plurality of cells connected in a predetermined circuit configuration to form a cell region in the block;
- a decoding circuit connected to the cells;
- an addressing circuit connected to the cells;
- a plurality of parallel conduction lines;
- a plurality of pairs of contact regions placed on opposite sites of the cell region in the block and interconnected by the conduction lines; and
- a block selector circuit connected to the block for the purpose of individually selecting a particular block of the electronic memory device; wherein one of the blocks includes a first controlled switch and a first contact region respectively of the pair of controlled switches and pair contact regions of the block, the first contact region includes first and second contacts coupled to first and second bit lines, and the first controlled switch includes a control terminal and is coupled between the first contact and a first conduction terminal of a selected memory cell having a second conduction terminal and a control terminal, the memory device further comprising an address transistor coupling the second bit line to the second conduction terminal of the selected memory cell, wherein during a read mode, the second contact and control terminals of the first controlled switch and the selected memory cell are coupled to a read voltage, the second conduction terminal is coupled to the second contact, and the first contact is coupled to ground.

8. The electronic memory device of claim 7 wherein the block selector circuit comprises a plurality of controlled switches, at least one for each conduction line, connected to the respective conduction lines and functioning as a block selector to the electronic memory device.

9. The electronic memory device of claim 8 wherein each controlled switch has a control terminal and the control terminals of all controlled switches on the same side of contact regions are connected together to form a single control terminal associated with the respective contact regions.

10. The electronic memory device of claim 8 wherein the controlled switches are formed by using a same technology as for forming the individual memory blocks.

11. The electronic memory device of claim 8 wherein the controlled switches are formed with a different technology from that used for forming the individual blocks.

12. The electronic memory device of claim 10 wherein the technology used is a MOS technology.

13. The electronic memory device of claim 8 wherein the controlled switch is MOS transistor.

14. An erasable, programmable electronic memory device, comprising:
- a matrix of memory cells arranged in rows and columns of cells, the cells of each respective column being connected to each other by a respective bit line and the cells of each respective row being connected to each other by a respective word line;
- a plurality of contact regions dividing the matrix into a plurality of cell blocks, each cell block including plural rows and columns of cells and being defined by first and second contact regions placed on opposite sites of the cell block, each of the first and second contact regions including a contact coupled to a respective bit line of the cell block;
- for each of the cell blocks, a plurality of block selector switches each having a control terminal connected to a block selector line of the cell block, a first conduction terminal connected to a respective one of the contacts of the first contact region defining the cell block, and a second conduction terminal connected to a respective one of the bit lines of the cell block;
- a write voltage applied to the control terminals of the block selector switches of a selected one of the cell blocks during an erase phase of the selected cell block; and
- an erase voltage applied to all of the contacts of the first contact region that defines the selected cell block.

15. The memory device of claim 14, wherein a negative or ground voltage is applied to all of the wordlines of the selected block during the erase phase.

16. The memory device of claim 14 wherein, of the cell blocks, the write voltage is applied only to the block selector line of the selected cell block during the erase phase of the selected cell block.

17. An erasable, programmable electronic memory device, comprising:
- a matrix of memory cells arranged in rows and columns of cells, the cells of each respective column being connected to each other by a respective bit line and the cells of each respective row being connected to each other by a respective word line;
- a plurality of contact regions dividing the matrix into a plurality of cell blocks, each cell block including plural rows and columns of cells and being defined by first and second contact regions placed on opposite sites of the cell block, each of the first and second contact regions including a contact coupled to a respective bit line of the cell block;
- for each of the cell blocks, a plurality of block selector switches each having a control terminal connected to a block selector line of the cell block, a first conduction terminal connected to a respective one of the contacts of the first contact region defining the cell block, and a second conduction terminal connected to a respective one of the bit lines of the cell block;
- an address transistor connected between a first bit line of a selected one of the cell blocks and a selected memory cell of the selected cell block, the selected memory cell being connected between the address transistor and a second bit line of-the selected cell block; and
- a write voltage connected, during write phase of the selected cell block, to the control terminals of the block selector switches of the selected cell block, to a control terminal of the address transistor, to the first bit line of the cell block, and to a word line coupled to a control terminal of the selected memory cell while the second bit line is held to a voltage less than the write voltage.

18. The memory device of claim 17 wherein, of the block selector lines, the write voltage is applied only to the block selector line of the selected cell block during the write phase of the selected cell block.

* * * * *